US006925828B1

(12) United States Patent
Gerstner et al.

(10) Patent No.: US 6,925,828 B1
(45) Date of Patent: Aug. 9, 2005

(54) DEVICE FOR COOLING AND ELECTRICAL APPLIANCE

(75) Inventors: Robert Gerstner, Augsburg (DE); Dieter Baumann, Haunsheim (DE); Detlev Noeldge, Augsburg (DE); Johannes Linne, Todtenweis (DE); Georg Ahn, Augsburg (DE)

(73) Assignee: Fujitsu Siemens Computers GmbH, Munich (DE)

( * ) Notice: Subject to any disclaimer, the term of this patent is extended or adjusted under 35 U.S.C. 154(b) by 228 days.

(21) Appl. No.: 10/019,426

(22) PCT Filed: Jun. 30, 2000

(86) PCT No.: PCT/DE00/02146

§ 371 (c)(1),
(2), (4) Date: May 10, 2002

(87) PCT Pub. No.: WO01/03483

PCT Pub. Date: Jan. 11, 2001

(30) Foreign Application Priority Data

Jun. 30, 1999 (DE) .............................. 199 30 166

(51) Int. Cl.[7] .............................................. G06F 1/20

(52) U.S. Cl. ...................... 62/259.2; 62/179; 165/80.3; 361/695

(58) Field of Search ................................ 165/203, 205, 165/206, 80.2, 80.3; 62/175, 186, 203, 179, 62/259.2; 361/694, 695, 697, 696

(56) References Cited

U.S. PATENT DOCUMENTS

| 4,537,245 A | * | 8/1985 | Nishimura et al. ......... 165/203 |
| 4,817,865 A | | 4/1989 | Wray |
| 5,121,291 A | | 6/1992 | Cope et al. |
| 5,718,628 A | | 2/1998 | Nakazato et al. |
| 5,764,506 A | | 6/1998 | Eynaud |
| 5,940,269 A | * | 8/1999 | Ko et al. .................... 361/697 |

FOREIGN PATENT DOCUMENTS

| DE | 43 09 187 | 6/1994 |
| JP | 08 316674 | 11/1996 |

OTHER PUBLICATIONS

"Intelligentes Power Management der neuesten Generation" http://www.andygrove.com/deutsch/mobile/mobilePCs/acpimen.html Jun. 21, 1999.

* cited by examiner

*Primary Examiner*—Harry B. Tanner
(74) *Attorney, Agent, or Firm*—Cohen, Pontani, Lieberman & Pavane

(57) ABSTRACT

A cooling device for an electric machine with thermal zones having interactions with one another is proposed, each of the thermal zones containing a heat source and a temperature sensor, and at least one cooling means, a controlling element connected to the temperature sensor being allocated to each thermal zone for activation of the at least one cooling means. The cooling device is characterized by the fact that outputs of a plurality of controlling elements can be connected to the at least one cooling means.

In an inventive cooling device, a plurality of controlling elements can act on one or more cooling means, whereby cooling means are supported or completely replaced by other existing cooling means.

7 Claims, 5 Drawing Sheets

DEVICE FOR COOLING AND ELECTRICAL APPLIANCE

This is a U.S. national stage of application No. PCT/DE00/02146, filed on 30 Jun. 2000.

The invention relates to a cooling device for a computer system.

Cooling devices in electric machines, such as computer systems, must be designed such that adequate cooling is achieved with little noise emission. At the same time, system safety must be increased and the costs lowered.

Intel, Microsoft and Toshiba have published an ACPI specification that describes some fundamental approaches to solving this problem. ACPI stands for "Advanced Configuration and Power Interface". It is an interface specification for the exchange of information between the hardware of a PC, the associated operating system and the associated peripheral devices. The specification defines a format in which operating system, motherboard hardware and peripheral devices, such as CD ROM drive, hard disk, etc. are able mutually to exchange data on energy consumption. The main goal of ACPI is to ensure Operating System Directed Power Management (OSPM), in which the operating system has access to all power management functions and thus can match the energy consumption of the individual devices precisely to the respective need (see Internet address http://www.andygrove.com/deutsch/mobile/mobilePCs/acpi-men.htm).

Figure 1:
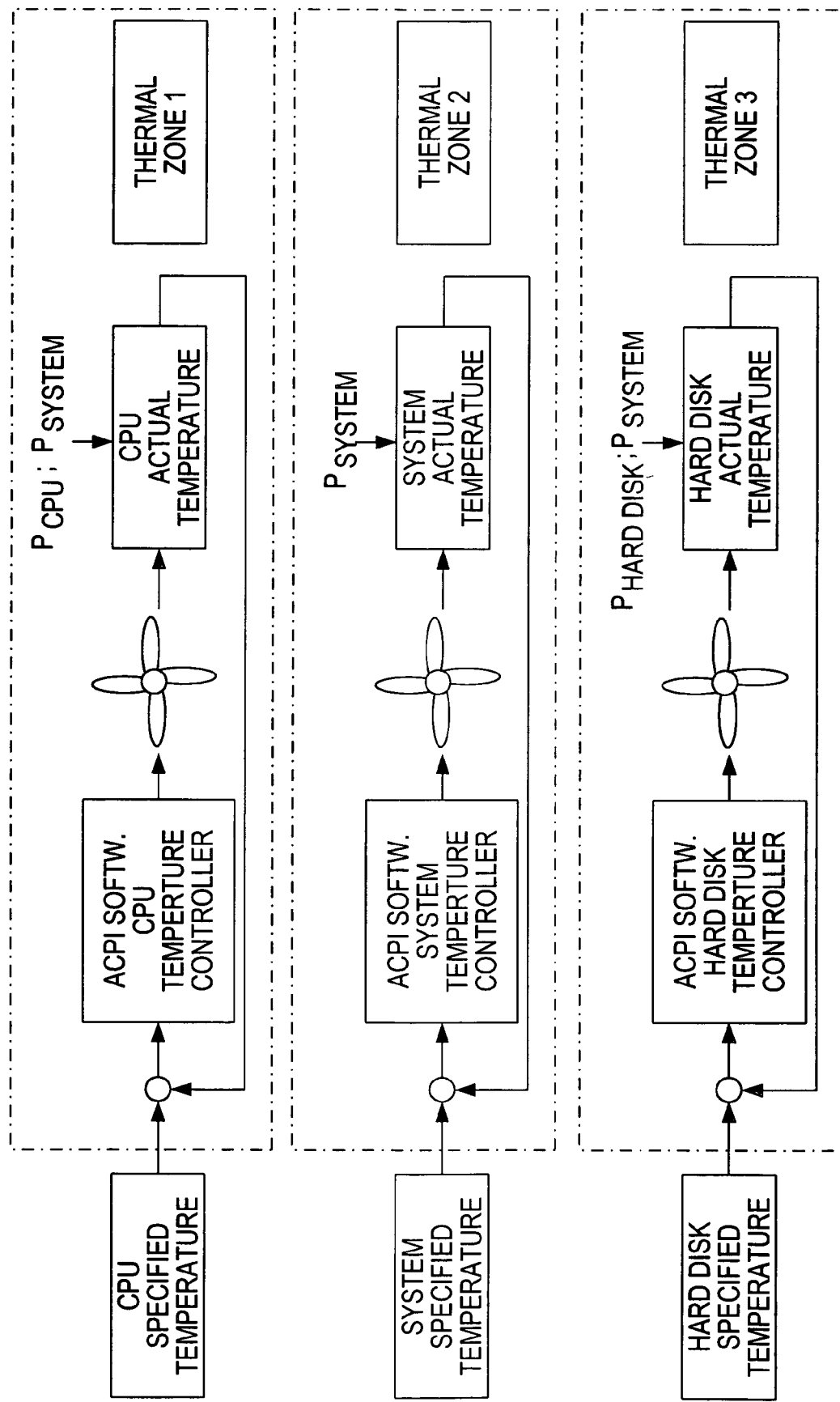

One problem of the ACPI specification is that, as illustrated in FIG. 1, it relates to individual thermally closed zones, each comprising a sensor and an associated cooling method, which in turn can comprise several units (such as fans). The control loop of a cooling method comprises the actuator for cooling (such as fan or CPU clock reduction/modulation), the actual-value sensor (temperature sensor), the perturbing variable (such as power loss of the CPU) and the controller. In ACPI, the controller, as a component of the operating system, is configured in software on the CPU of the computer system. This requires that the computer system be fully functional, and means in turn that the cooling control loop is intact only as long as the cooling system is functioning.

In the example of FIG. 1, implemented according to ACPI, the system comprises three mutually independent zones. A further problem in this connection is that thermal interactions between the zones are not sensed. This in turn means that no allowance can be made for them.

The object of the present invention is to provide an improved cooling device for an electric machine, which ensures adequate cooling with little noise emission and thus creates the possibility that cooling means can be made smaller or completely eliminated, that universal adaptation to various machine configurations is feasible, or that the cooling loop remains functional even if the system to be cooled has failed. A further object is to provide a temperature-control unit for such a cooling device.

This object is achieved by a cooling device with thermal zones that have thermal interactions with one another, each of the thermal zones containing a heat source. The cooling device comprises a temperature sensor in each of the thermal zones. At least two cooling means are provided. For each of the thermal zones, a controlling element is coupled to the temperature sensor of such thermal zone for activation of the at least two cooling means. An allocation matrix couples an output of at least one of the controlling elements to the two cooling means, and the allocation matrix is coupled between a plurality of the controlling elements and the at least two cooling means.

The inventive cooling device advantageously exploits the circumstance that interactions exist between the individual thermal zones. By virtue of the interactions, the cooling method for one thermal zone exerts an influence on another thermal zone. This situation is advantageously exploited to the effect that the cooling means of the one thermal zone support the cooling means of the other thermal zone. It may then even be possible to dispense completely with cooling means. To ensure that this advantage is obtained, thermal zones interacting with one another are combined as one uniform thermal zone, whereby the individual cooling means provided therein can supplement or replace one another. Such a cooling device has the further advantage that it is the basis for further advantageous embodiments.

An embodiment of the invention uses maximum-value generators and/or at least one allocation matrix.

Maximum-value generators make it possible to determine a manipulated variable on the basis of information from a plurality of controlling elements, of which that which indicates the most critical case is ultimately used for control. In this way it is ensured that the most critical temperature always dictates which variable will be manipulated.

On the one hand, the allocation matrix permits flexible allocation of more than one controlling element (for CPU and system temperature, for example) per actuator (fan, for example). On the other hand, the allocation matrix also permits flexible allocation of one controlling element to a plurality of actuators.

The combination of a flexible allocation matrix with maximum-value generators permits universal interconnection of controlling elements and actuators present in a system, such that the proposed cooling device can be used with the above advantages for all system configurations.

A further embodiment of the invention offers the advantage that control of the cooling functions is also completely operable even if the operating system or the CPU and the associated components such as chipset, memory, etc. of a computer system, considered as an example of an electric machine, are malfunctioning. Thus an increase in reliability of an affected system is achieved with the invention. Furthermore, the cooling function is assured even if the operating system does not support any power management functions such as ACPI.

The basis of the advantageous embodiment is that the control systems are decoupled from the thermal zones to be monitored. It is no longer the unit to he cooled, such as the CPU of a computer system and its components, that is responsible for monitoring and control of cooling, but instead monitoring and control of cooling take place independently of the system to be cooled.

If functions for monitoring and cooling control are implemented in an independent unit, devices which originally were not designed with a cooling mechanism can be operated according to the principles of the cooling device disclosed herein. Moreover, ASICs or microcontrollers are can be used cost-effectively for such units. Such ASICs or microcontrollers, for example, do not have to be designed exclusively for monitoring and cooling control.

Figure 3:
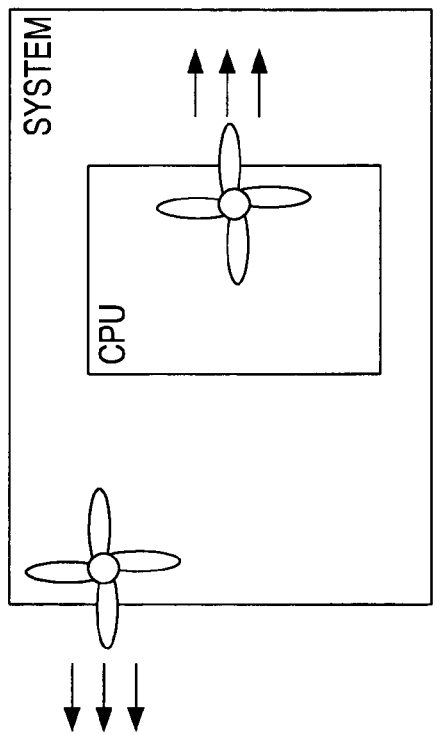
Figure 2:
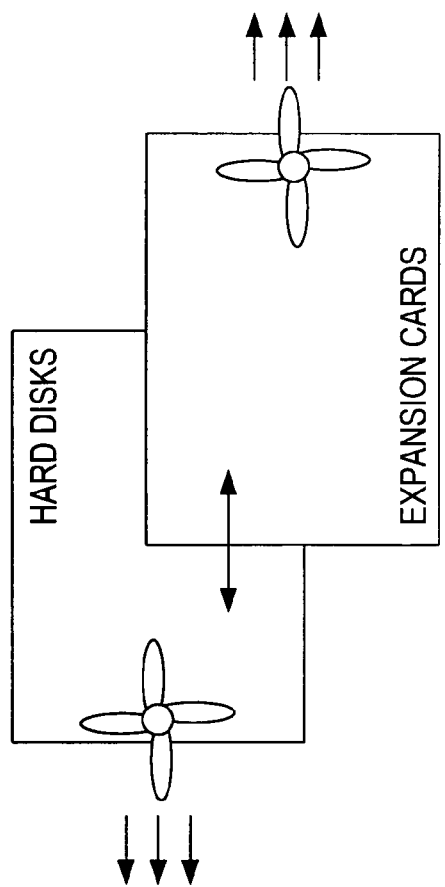
Figure 4:
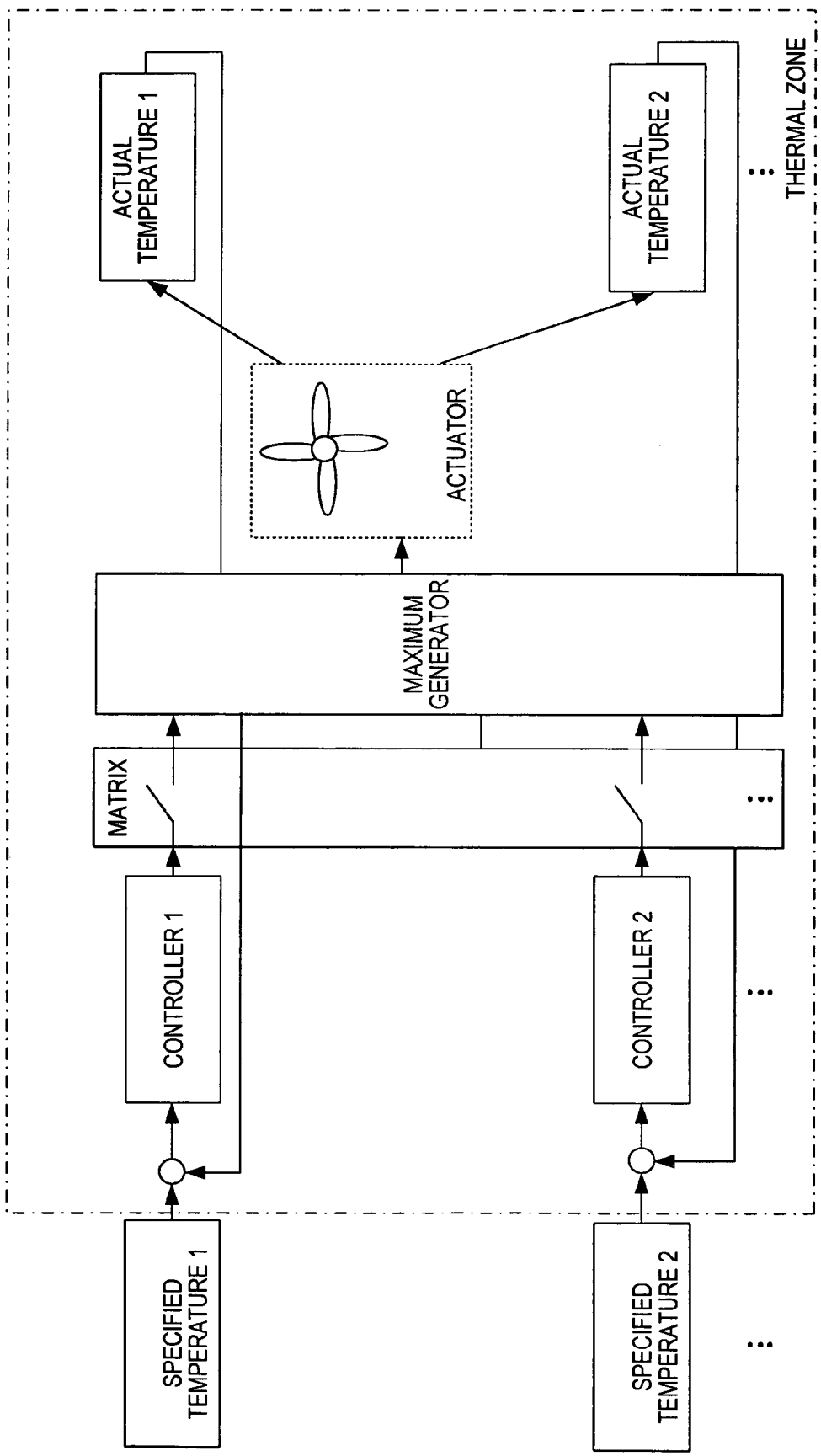
Figure 5:
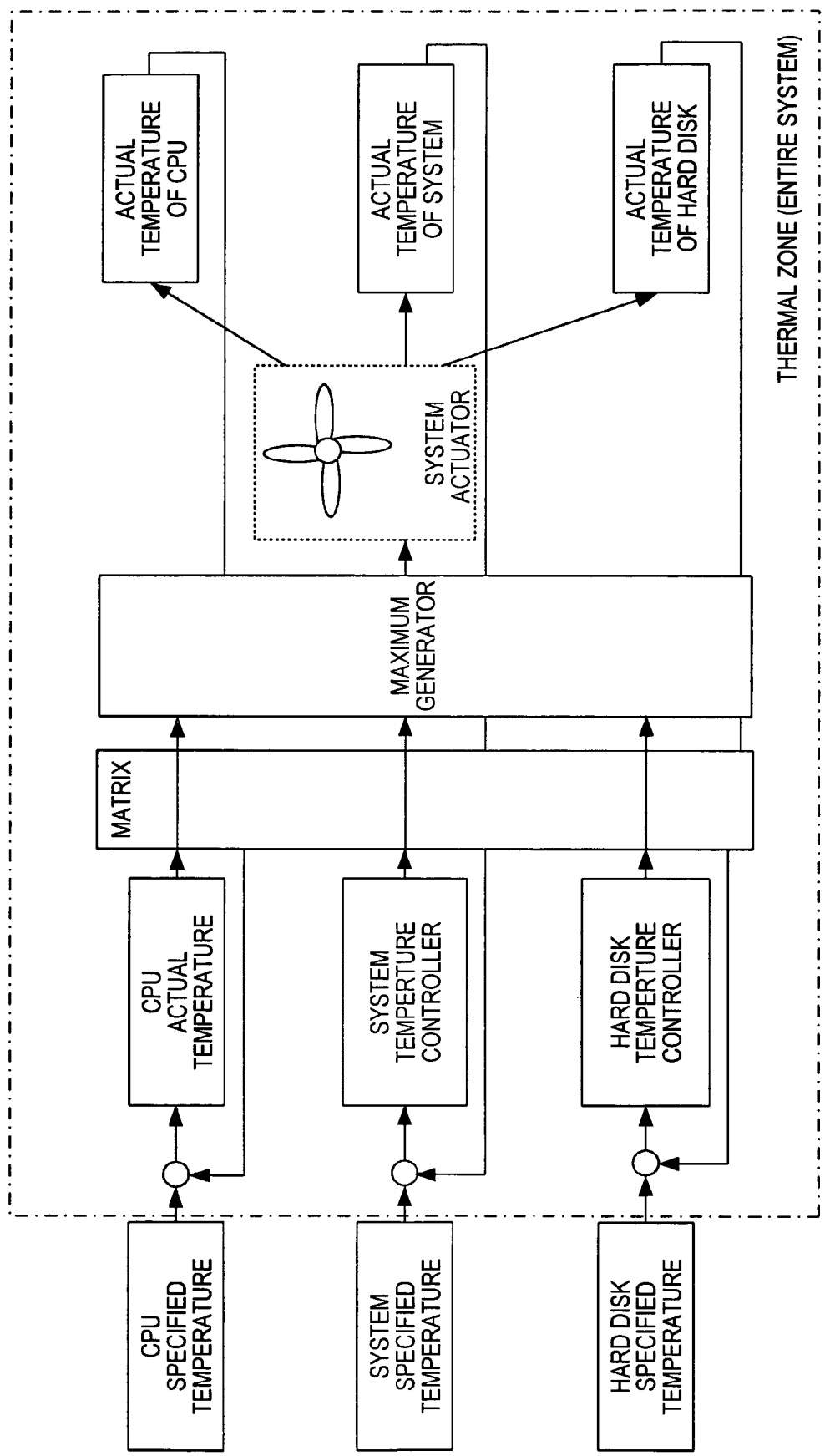
Figure 6:
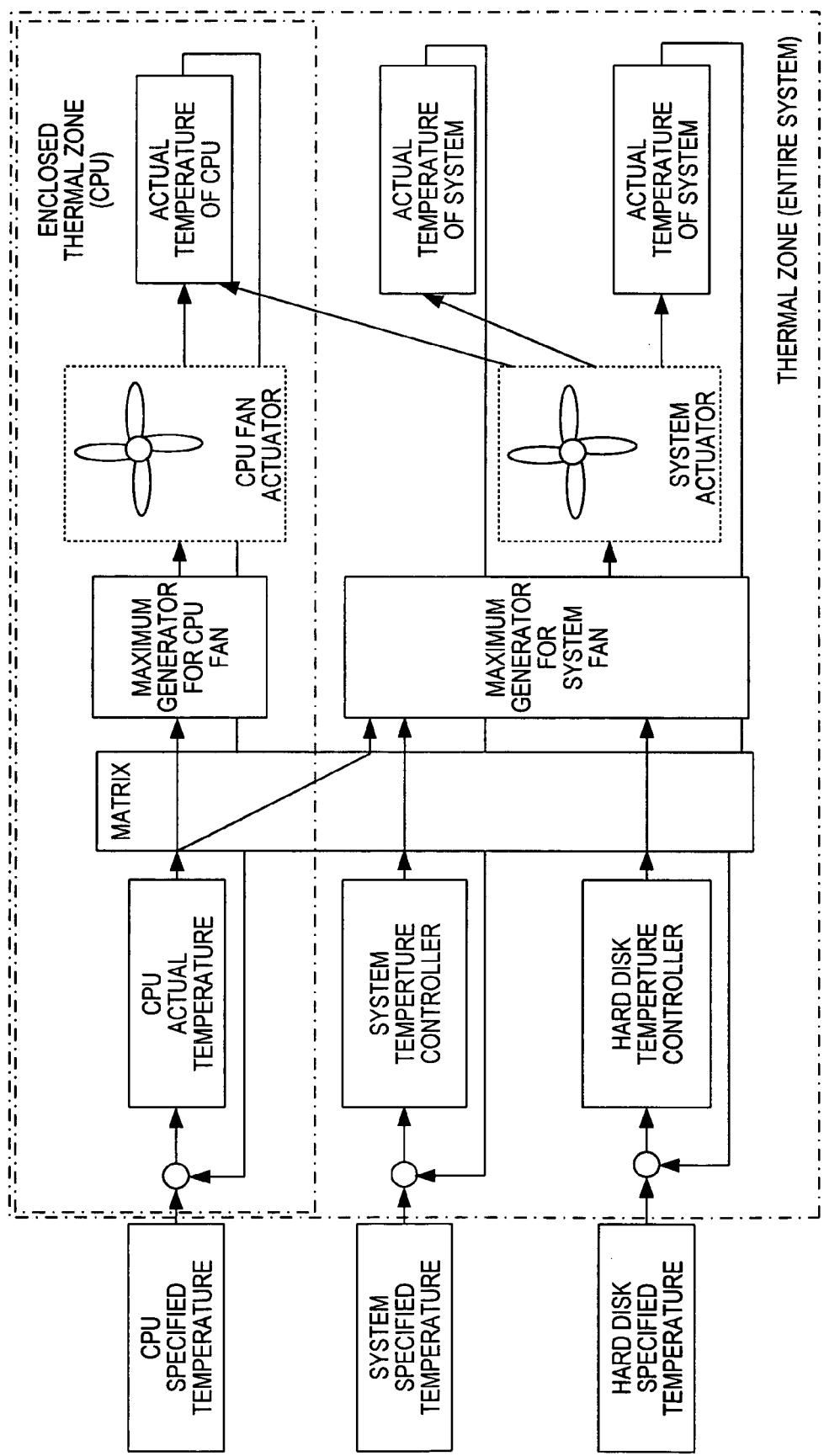

Further explanations will be provided and two practical examples of the invention will be described in more detail hereinafter with reference to a drawing, wherein, individually, FIG. 1 shows a system structure of an electric machine subdivided into thermal zones, according to the prior art, FIG. 2 shows a system structure of an electric machine subdivided into thermal zones, wherein the thermal zones overlap, according to the prior art, FIG. 3 shows a system structure of an electric machine subdivided into thermal zones, one of the thermal zones being enclosed, according to the prior art, FIG. 4 shows in principle the system structure according to the invention, FIG. 5 shows a first practical example according to the invention, and FIG. 6 shows a second practical example according to the invention.

FIG. 2 shows an example of overlapping thermal zones. FIG. 3 shows an example of enclosed thermal zones.

Overlapping or enclosed thermal zones such as illustrated in principle in FIGS. 2 and 3 are found frequently in practice. In these cases, thermal interactions take place between the individual thermal zones.

FIG. 4 shows a schematic diagram of an inventive cooling device for a single actuator. In contrast to other principles (such as ACPI), allowance for thermal interaction between the different thermal zones can be made with such a cooling device. For this purpose all thermal zones with interactions are reduced to one thermal zone in which all temperature sensors (actual-value sensors) and cooling methods (actuators) are enclosed. Allowance for the interaction is achieved since, in a cooling device according to FIG. 4, not only one single controlling element but also a plurality of controlling elements can influence a actuator. For this purpose the embodiment provides a flexible allocation matrix for the controlling elements and a maximum-value generator to generate maximum values for each actuator. In this way the practical requirements of overlapping or enclosed thermal zones are taken into account.

This has the advantageous effect that the number of necessary fans can often be decreased, thus lowering costs and reducing noise emission.

A further advantage is that, in systems with several cooling methods, the expense for each individual cooling method can be reduced by allowing for the interactions. An example of several cooling methods is a system with an "enclosed thermal zone". Such a system is, for example, a CPU with attached fan in a PC cabinet containing a power supply with integrated fan. Instead of designing the cooling method corresponding to the enclosed zone (CPU fan) for the worst case (minimal air flow in the system), an excessive rise of CPU temperature is also countered by increasing the speed of the fan in the power supply. Thereby the temperature in the electric machine is lowered and the flow velocity is increased even in the region of the CPU, thus improving cooling of the CPU. Here also the costs and the noise emission can be reduced by appropriate choice of parameters.

FIG. 5 shows a practical example in which cooling of a PC system is achieved with only one fan and 3 sensors. In this example, the flexible allocation matrix is used only for connecting the three controlling elements to the maximum-value generator for the "system fan" actuator. The three thermal zones (CPU, hard disk and system) have an interaction. The system fan functioning as actuator acts on all thermal zones. This arrangement is therefore combined as one "entire system" thermal zone, and the fan speed is dictated by generation of a maximum value from the three controller output variables. In other words, the most critical temperature dictates the fan speed. Minimization of the costs and of the fan noise is achieved by the reduction to only one fan in the system.

FIG. 6 shows a practical example relating to cooling of a system in which the CPU is a thermal "hot spot" with its own fan. In such a typical computer system, it may be practical to provide an additional cooling method (tan, clock reduction, . . . ) for the CPU "hot spot", since the system fan or the fan in the power supply indeed has an influence on the CPU temperature, but is spatially too far away, or the air stream cannot be directed selectively onto the CPU.

In this example the combination of CPU and CPU fan is an enclosed thermal zone, which has an interaction with the surrounding "entire system" thermal zone.

The control loop for the "CPU fan" actuator is a classical controller such as can also be implemented with ACPI. Since in this case only the "CPU temperature" controller influences the "CPU fan" actuator, no maximum-value generation would be necessary for this actuator. Nevertheless, this universal arrangement makes it possible at any time to connect the influence of a further controlling element to the actuator by means of the flexible allocation matrix.

The three thermal zones (CPU, hard disk and system) have an interaction. The system fan functioning as actuator acts on all three thermal zones. This arrangement is therefore combined as an "entire system" thermal zone, and the fan speed is dictated by generation of a maximum from the three controller output variables. As in the foregoing example, this maximum generation ensures that the speed of the system fan corresponds to the most critical temperature. The flexible allocation matrix in this case ensures that the "CPU temperature" controlling element influences both actuators (CPU and system fans).

Since both cooling methods have an influence on the CPU temperature, it is ensured hereby that the cooling method for the enclosed zone is selectively unburdened by the cooling method of the surrounding zone. Instead of designing the cooling method corresponding to the enclosed zone (CPU fan) for the worst case (minimal air flow in the system, or maximum internal temperature of the system), an excessive rise of CPU temperature is also countered by increasing the speed of the system fan. In this situation the CPU fan can be designed for lighter duty by appropriate choice of the control parameters. In turn, the costs and the noise emission are reduced hereby.

What is claimed is:

1. A cooling device for a computer system with thermal zones that have thermal interactions with one another, each of the thermal zones containing a heat source, the cooling device comprising:
    a temperature sensor in each of the thermal zones,
    at least two cooling means,
    for each of said thermal zones, a controlling element coupled to the temperature sensor of such thermal zone for activation of said at least two cooling means, and
    an allocation matrix coupling an output of at least one of said controlling elements to said two cooling means, and said allocation matrix is coupled between a plurality of said controlling elements and the said at least two cooling means.

2. A cooling device according to claim 1, further comprising a maximum-value generator for recognition of critical conditions and connected between a plurality of controlling elements and the at least one cooling means.

3. A cooling device according to claim 1 wherein the cooling means are fans.

4. A cooling device according to claim 1, wherein the controlling elements are implemented with an ASIC and/or microcontroller chip or are implemented as part thereof.

5. A cooling device according to claim 2, wherein the cooling means are fans.

6. A cooling device according to claim 2, wherein the controlling elements are implemented with an ASIC and/or microcontroller chip or are implemented as part thereof.

7. A cooling device according to claim 3, wherein the controlling elements are implemented with an ASIC and/or microcontroller chip or are implemented as part thereof.

* * * * *